US012687773B1

(12) United States Patent
He et al.

(10) Patent No.: US 12,687,773 B1
(45) Date of Patent: Jul. 21, 2026

(54) PATTERN-BASED HIERARCHY EXPLORATION FOR COMPRESSING AN INTEGRATED CIRCUIT DESIGN LAYOUT

(71) Applicant: Synopsys, Inc., Mountain View, CA (US)

(72) Inventors: Yuan He, Mountain View, CA (US); Joshua P. Tuttle, Beaverton, OR (US); Lin Wang, Austin, TX (US); Yongdong Wang, Portland, OR (US)

(73) Assignee: Synopsys, Inc., Sunnyvale, CA (US)

( * ) Notice: Subject to any disclaimer, the term of this patent is extended or adjusted under 35 U.S.C. 154(b) by 800 days.

(21) Appl. No.: 18/058,614

(22) Filed: Nov. 23, 2022

Related U.S. Application Data

(60) Provisional application No. 63/284,795, filed on Dec. 1, 2021.

(51) Int. Cl.
 *G03F 1/70* (2012.01)
 *G06T 7/12* (2017.01)
 *G06T 7/70* (2017.01)

(52) U.S. Cl.
 CPC .................. *G03F 1/70* (2013.01); *G06T 7/12* (2017.01); *G06T 7/70* (2017.01); *G06T 2207/20021* (2013.01)

(58) Field of Classification Search
 USPC ........ 716/100, 110, 111, 112, 119, 124, 125, 716/134
 See application file for complete search history.

(56) References Cited

U.S. PATENT DOCUMENTS

| | | | | |
|---|---|---|---|---|
| 6,324,673 | B1 * | 11/2001 | Luo | G06F 30/398 |
| | | | | 438/18 |
| 2007/0198960 | A1 * | 8/2007 | Fotakis | G06F 30/3947 |
| | | | | 716/129 |
| 2009/0077527 | A1 * | 3/2009 | Gergov | G03F 1/68 |
| | | | | 430/5 |
| 2011/0113398 | A1 * | 5/2011 | Keinert | G06F 30/394 |
| | | | | 716/127 |
| 2015/0008343 | A1 * | 1/2015 | Wang | H01J 37/3026 |
| | | | | 250/492.22 |
| 2015/0269301 | A1 * | 9/2015 | Balkan | G06F 30/392 |
| | | | | 716/122 |
| 2015/0363532 | A1 * | 12/2015 | Bashaboina | G06F 30/392 |
| | | | | 716/54 |

* cited by examiner

*Primary Examiner* — Brian Ngo
(74) *Attorney, Agent, or Firm* — Laxman Sahasrabuddhe; Park, Vaughan, Fleming & Dowler LLP

(57) ABSTRACT

An integrated circuit (IC) design layout may be partitioned into a set of content areas. A content area in the set of content areas may be divided into a set of zones based on an image-based representation of the content area. A repetition unit may be identified in a zone in the set of zones, where the repetition unit is a portion of the zone, and where the zone includes multiple instances of the repetition unit. A skeleton layout may be generated corresponding to the IC design layout, where the skeleton layout specifies locations of the multiple instances of the repetition unit in the IC design layout.

18 Claims, 9 Drawing Sheets layout 100

Logic area
102

Core area
106

Bit cell area
104

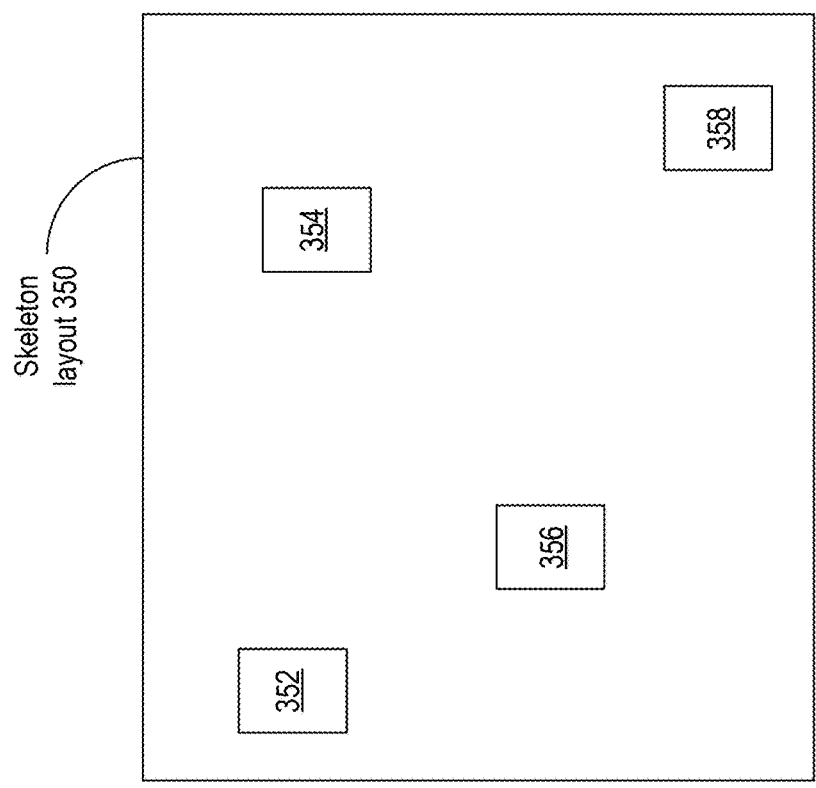
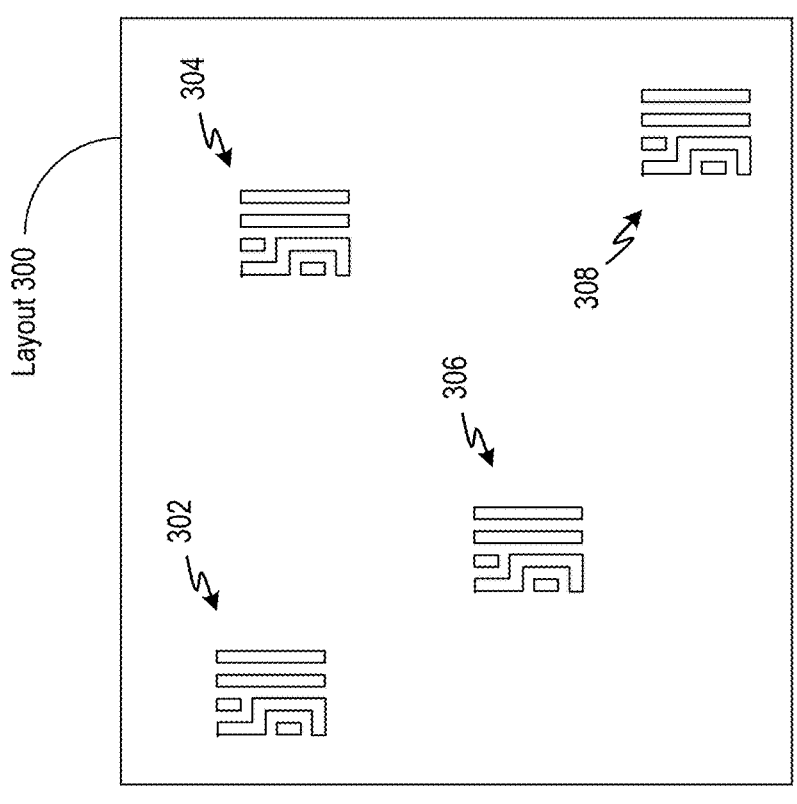
FIG. 3

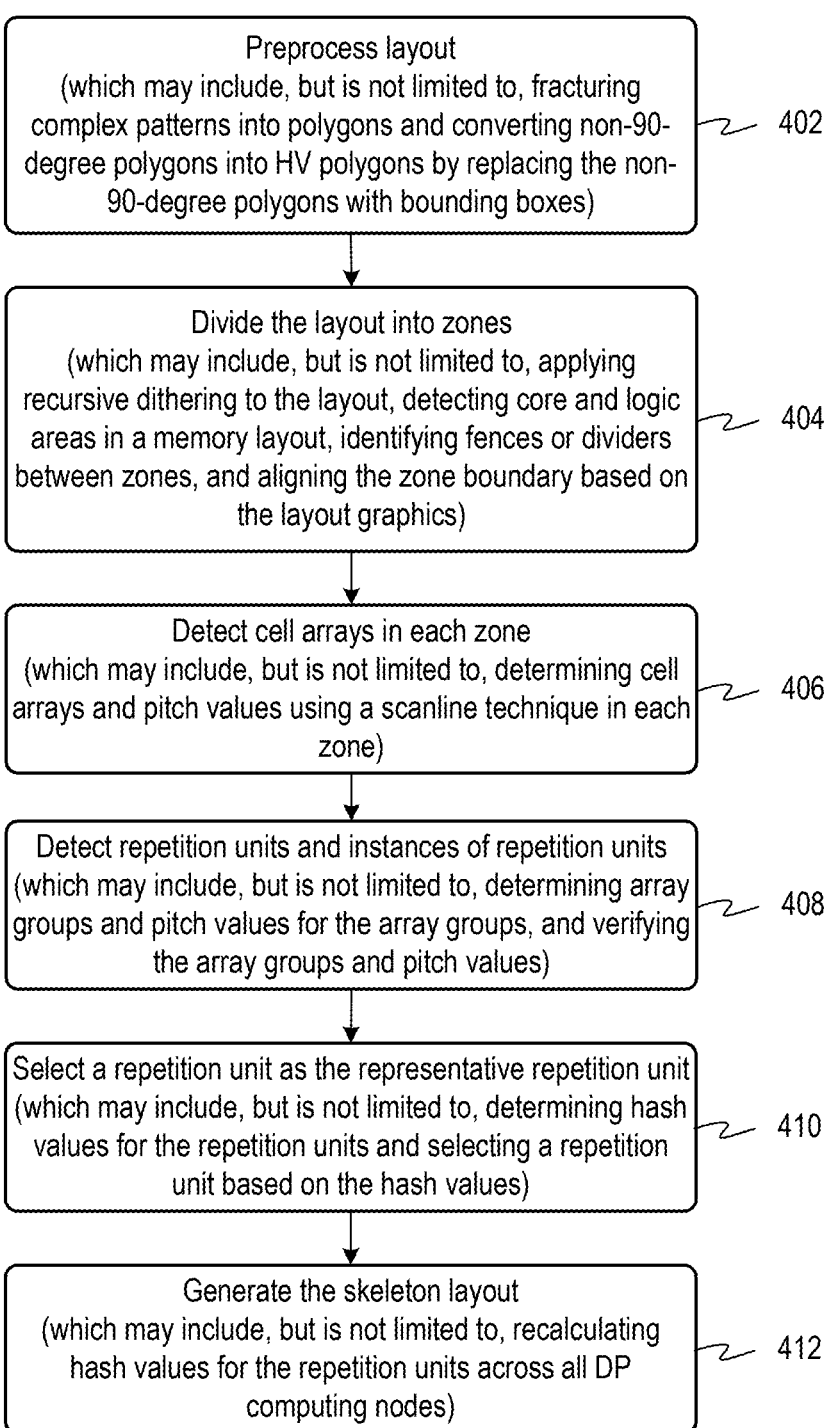

Preprocess layout
(which may include, but is not limited to, fracturing complex patterns into polygons and converting non-90-degree polygons into HV polygons by replacing the non-90-degree polygons with bounding boxes)          402

Divide the layout into zones
(which may include, but is not limited to, applying recursive dithering to the layout, detecting core and logic areas in a memory layout, identifying fences or dividers between zones, and aligning the zone boundary based on the layout graphics)          404

Detect cell arrays in each zone
(which may include, but is not limited to, determining cell arrays and pitch values using a scanline technique in each zone)          406

Detect repetition units and instances of repetition units
(which may include, but is not limited to, determining array groups and pitch values for the array groups, and verifying the array groups and pitch values)          408

Select a repetition unit as the representative repetition unit
(which may include, but is not limited to, determining hash values for the repetition units and selecting a repetition unit based on the hash values)          410

Generate the skeleton layout
(which may include, but is not limited to, recalculating hash values for the repetition units across all DP computing nodes)          412

FIG. 4

Portion of
layout
500
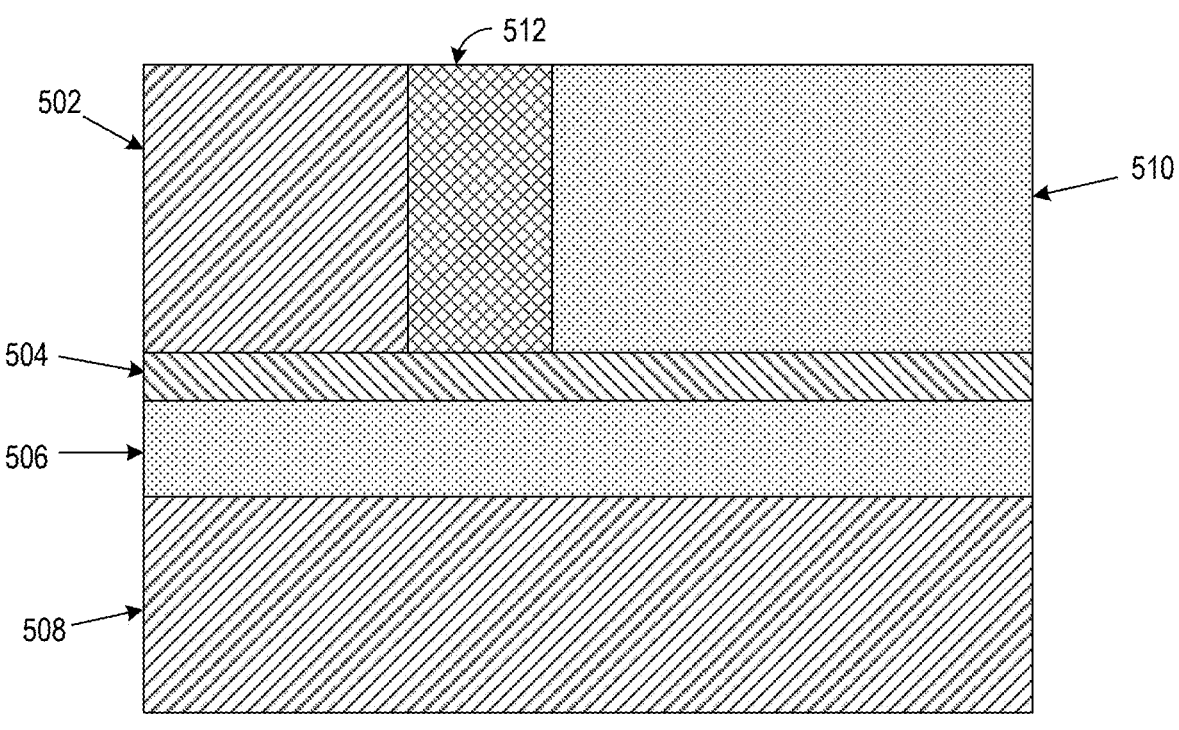
FIG. 5

Portion of a
memory
layout
600
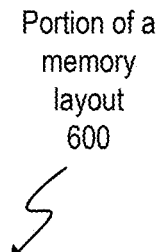
Y-arm zones
602
Bitcell arrays
604
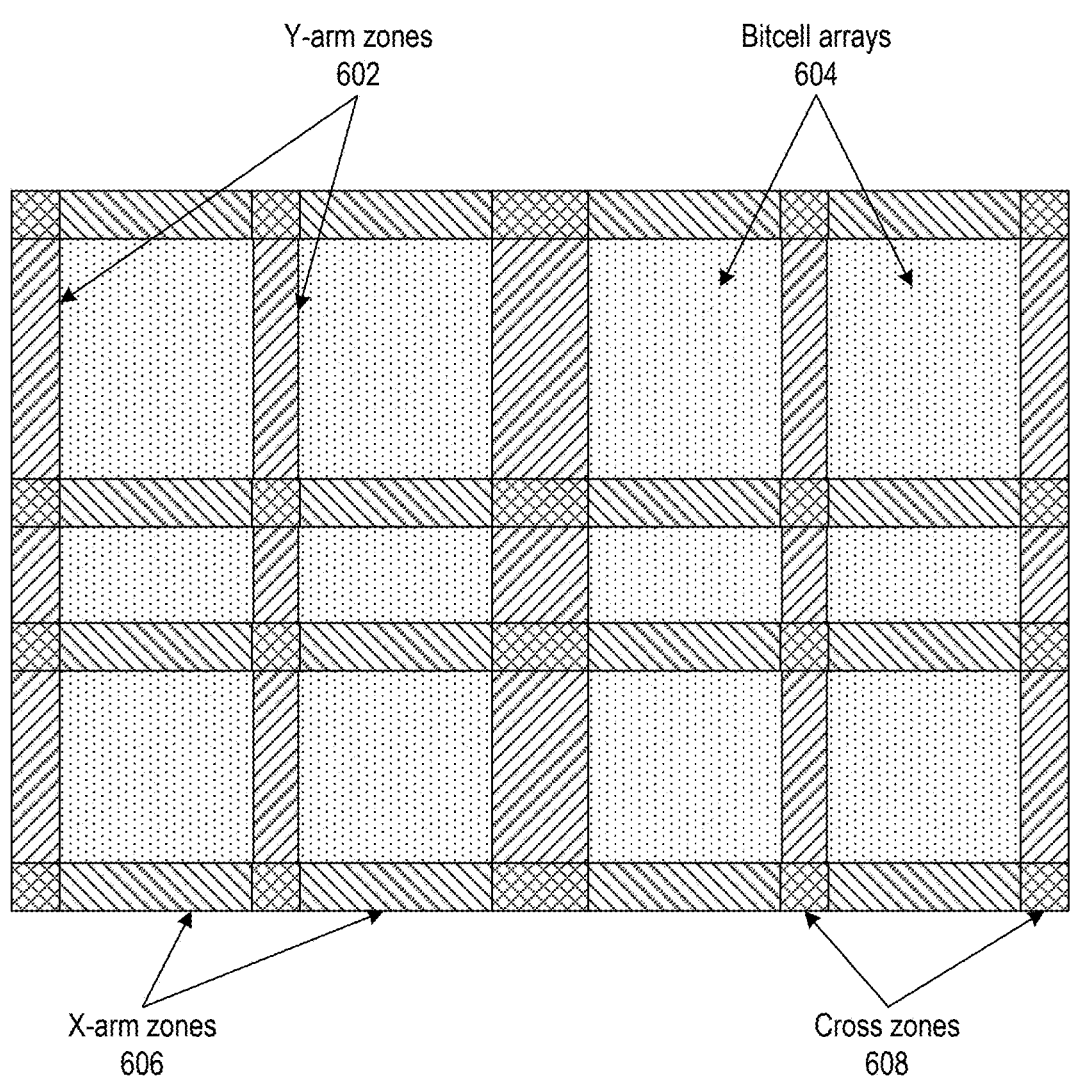
X-arm zones
606
Cross zones
608
FIG. 6

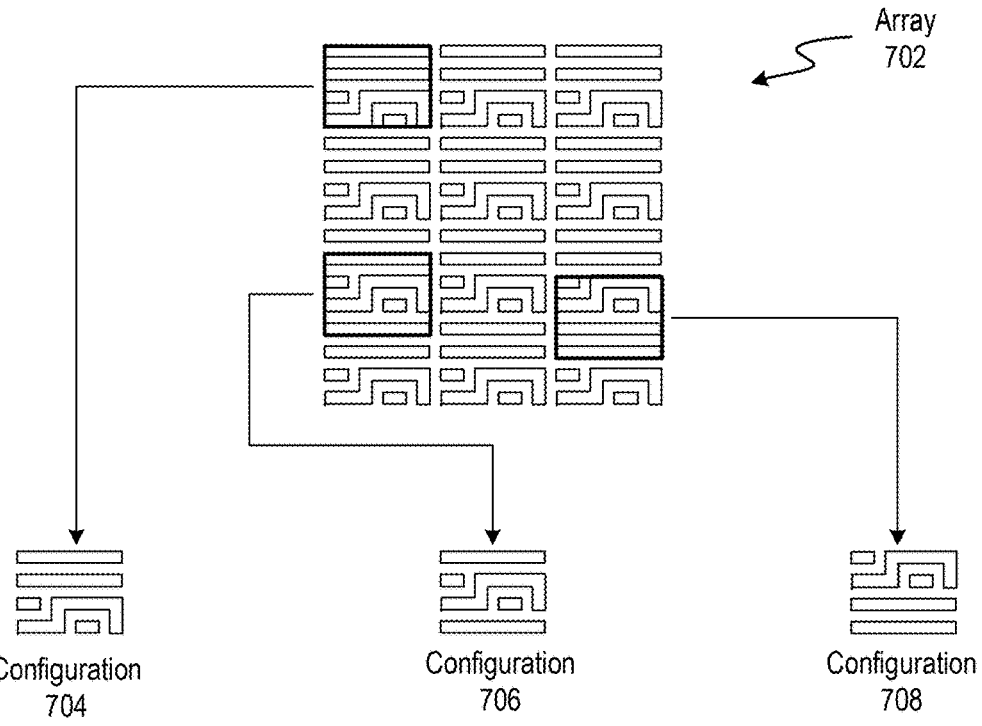

Configuration 704

Configuration 706

Configuration 708

FIG. 7

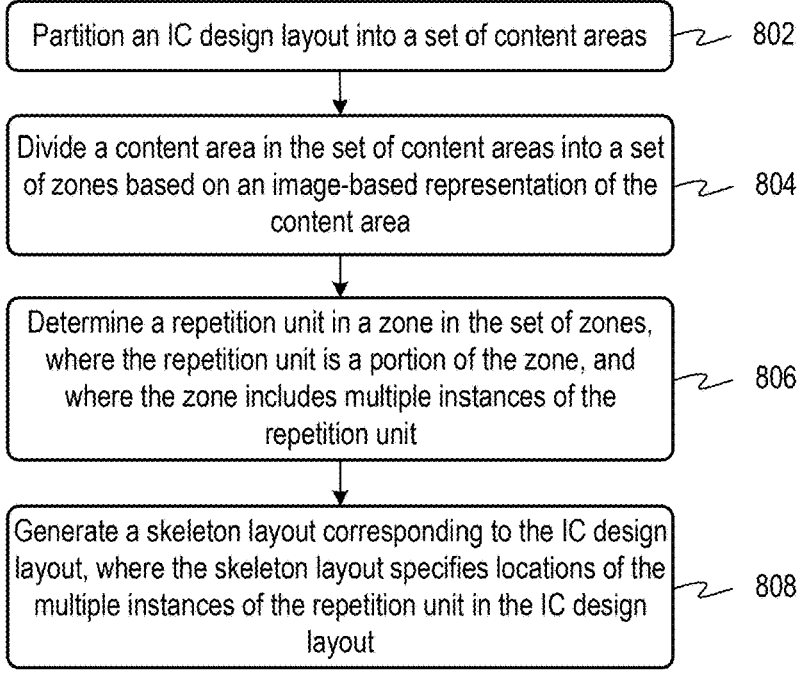

Partition an IC design layout into a set of content areas ~ 802

Divide a content area in the set of content areas into a set of zones based on an image-based representation of the content area ~ 804

Determine a repetition unit in a zone in the set of zones, where the repetition unit is a portion of the zone, and where the zone includes multiple instances of the repetition unit ~ 806

Generate a skeleton layout corresponding to the IC design layout, where the skeleton layout specifies locations of the multiple instances of the repetition unit in the IC design layout ~ 808

FIG. 8

PATTERN-BASED HIERARCHY EXPLORATION FOR COMPRESSING AN INTEGRATED CIRCUIT DESIGN LAYOUT

RELATED APPLICATION

This application claims the benefit of U.S. Provisional Application Ser. No. 63/284,795, filed on 1 Dec. 2021, the contents of which are herein incorporated by reference in their entirety for all purposes.

TECHNICAL FIELD

The present disclosure relates to electronic design automation (EDA). More specifically, the present disclosure relates to pattern-based hierarchy exploration for compressing an integrated circuit (IC) design layout.

BACKGROUND

Advances in process technology and an almost unlimited appetite for computing and storage have fueled a rapid increase in the size and complexity of IC designs. It is important to improve performance of software applications that are used for creating IC designs.

SUMMARY

Embodiments described herein may feature pattern-based hierarchy exploration for compressing an IC design layout. An IC design layout may be partitioned into a set of content areas. A content area in the set of content areas may be divided into a set of zones based on an image-based representation of the content area. A repetition unit may be determined in a zone in the set of zones, where the repetition unit is a portion of the zone, and where the zone includes multiple instances of the repetition unit. A skeleton layout corresponding to the IC design layout may be generated, where the skeleton layout specifies locations of the multiple instances of the repetition unit in the IC design layout.

In some embodiments described herein, a distributed processing (DP) system may be used, which may include a master node and a set of DP nodes. In these embodiments, partitioning the IC design layout into the set of content areas may be performed by the master node, dividing each content area in the set of content areas into the set of zones and determining the repetition unit in the zone in the set of zones may be performed by a respective DP node, and generating the skeleton layout corresponding to the IC design layout may be performed by the master node.

In some embodiments described herein, partitioning the IC design layout into the set of content areas may include partitioning the IC design layout into a set of abutting tiles and creating the set of content areas based on the set of abutting tiles, where each content area in the set of content areas is larger than and encloses a corresponding tile in the set of abutting tiles.

In some embodiments described herein, dividing the content area in the set of content areas into the set of zones may include using an image-based boundary detection technique to detect a zone boundary in the content area. In some embodiments, the zone boundary may be moved so that the zone boundary aligns with an edge of a polygon which is located within an ambit of the zone boundary.

In some embodiments described herein, determining the repetition unit in the zone in the set of zones may include determining a set of hash values corresponding to a set of detection boxes aligned with different polygon corners in the zone, selecting a hash value in the set of hash values, and selecting a detection box that corresponds to the hash value.

In some embodiments described herein, an instance of the repetition unit may be selected from the multiple instances of the repetition unit specified in the skeleton layout. Mask correction may be performed on the instance of the repetition unit to obtain a corrected repetition unit. The multiple instances of the repetition unit may be replaced by the corrected repetition unit in the IC design layout.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

FIG. 3 illustrates a layout and a skeleton layout in accordance with some embodiments described herein.

FIG. 4 illustrates a process for pattern-based hierarchy exploration for compressing an IC design layout in accordance with some embodiments described herein.

FIG. 5 illustrates partitioning a layout into zones in accordance with some embodiments described herein.

FIG. 6 illustrates identifying different zones in a memory layout using an image-based zone identification technique in accordance with some embodiments described herein.

FIG. 7 illustrates selecting a representative repetition unit in accordance with some embodiments described herein.

FIG. 8 illustrates a process for generating a skeleton layout from an IC design layout in accordance with some embodiments described herein.

DETAILED DESCRIPTION

Figure 1:
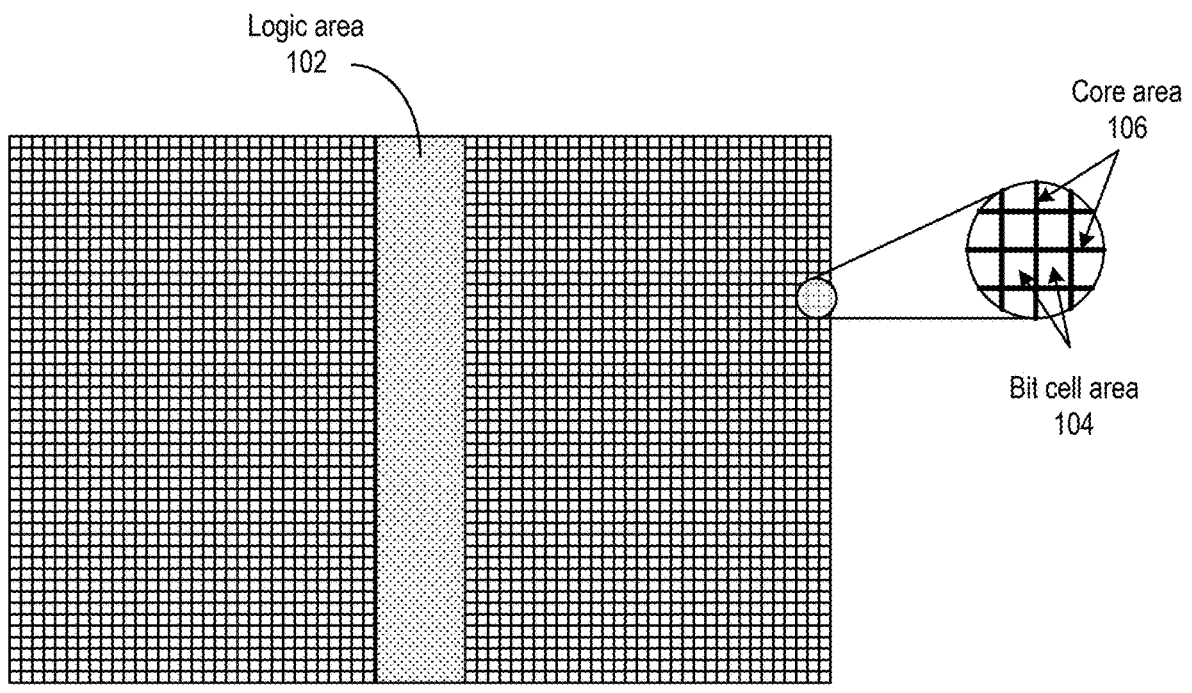
FIG. 1 illustrates a memory layout in accordance with some embodiments described herein.

A full-chip layout in production may include billions of polygons, which may be generated using one or more EDA tools during an IC design process. To produce IC chips, the polygons may be etched onto a photomask for exposing patterns onto silicon wafers using a photolithography process in a semiconductor fabrication facility. Before the photomask can be manufactured, the polygons may be preprocessed to make the printed polygons as close to desired shapes as possible during photolithography. This process of preprocessing the polygons may be referred to as mask correction, which may be very challenging because of the computational complexity and the large amount of computational resources required to perform this process on billions of polygons.

The computational performance of mask correction may be improved using layout compression. The term "repetition unit" may refer to a portion of an IC design layout that is repeated at multiple locations in the IC design layout. In layout compression, a repetition unit may be identified, which may include a cluster of polygons that appear at multiple locations in the chip layout. A single instance of a repetition unit may be corrected, and each occurrence of the repetition unit may be replaced by the corrected repetition unit. Computational performance may be increased because the mask correction is only performed once on the single instance of the repetition unit, and the corrected repetition unit is then copied to the other instances of the repetition unit, which may save considerable computational resources. Layout compression is one of the most effective runtime reduction technologies for mask correction.

A layout compression ratio may be defined as the ratio between the size of a compressed layout representation and the uncompressed layout representation. Memory designs usually have regular layout patterns that cover a large portion of the design, and layout compression ratios can reach 10× to 1000× for such layouts. For other types of layouts, e.g., logic designs or system on chip (SoC) designs, the layout compression ratio may depend on the size of the repetition units and the extent to which repetition units can be discovered and compressed. In other words, different areas in a chip layout may require different compression techniques to achieve high layout compression ratios. Thus, the type of layout compression technique that is used for an area of the layout may depend on the type of circuitry that is present in the area because a single layout compression technique may not work for all types of circuitries.

Terms such as "repetition portion," "repetition unit," "repeating portion," and "repeating unit" may be used interchangeably in this disclosure. During mask correction, a given polygon in the layout may be corrected based on a set of polygons that are in the vicinity of the given polygon. The set of polygons are determined by using a lithography ambit, i.e., polygons that are within the lithography ambit are used for determining corrections for the given polygon. A repeating unit may be significantly larger than the lithography ambit.

Some techniques for detecting repetition units may depend on the existence and accuracy of hierarchy information. The term "hierarchy information" may generally refer to information that identifies the type of circuitry that exists in different areas of a layout. Lack of hierarchy information or a poor quality of hierarchy information (e.g., an overlapping or incomplete hierarchy specification) may cause such techniques to miss repetition units in the layout or even produce incorrect results.

Some techniques may detect unique patterns in the layout and process each pattern separately. These techniques may be referred to as pattern-matching techniques. In these techniques, the corrected solutions of different instances of the same pattern may be averaged and then replicated across the full chip to improve mask synthesis consistency. These techniques typically use extensive analysis and geometric comparison of all patterns in a full chip, which uses significant computation overhead during mask correction due to the sheer number of patterns that are analyzed. Typically, these techniques may be used as a last resort, i.e., when other techniques that use less computation are not suitable. For example, these techniques may be used logic areas where the repetition units may be small and discontinuous.

Some techniques may generate repetition units by exploring geometrical periodicities of regular polygon arrays in a layout. In these techniques, a desired minimum repetition unit size may be provided. These techniques are suitable for layout areas that include large and highly regular arrays, e.g., bit cell arrays in static random-access memory (SRAM) designs.

The above-mentioned techniques are not suitable for core areas in a memory design. A memory design may include an array of bit cells, a core area, and a logic area. The core area may include interconnections between bit cells and other functional circuits in memory layout. Specifically, a core area may form a grid shape with many rows and columns, where each grid may include a bit cell array that are served by the circuitry in the surrounding core area. The above-mentioned techniques may not be suitable for compressing core area patterns because core area patterns have a hierarchy that is not fully regular and may include random pattern placement. If the core area is not compressed, it may use a large amount of computation during mask correction.

Some embodiments described herein may be used for compressing core areas in memory designs. Embodiments described herein may use multiple techniques including, but are not limited to, (1) image-based zone division, (2) hybrid repetition unit discovery, (3) distributed processing (DP)-local template boundary handling, and (4) in-memory database-based DP-master communication for faster turn-around-time (TAT).

Image-based zone division may identify boundaries between large repetition units in highly complex or irregular geometrical pattern placements. Hybrid repetition unit discovery may be implemented based on geometrical periodicity calculation in a regular polygon array (scanline) or hash value matching among arbitrary pattern clusters. In DP-local template boundary handling, the full chip core area may be divided into large tiles, and repetition units may be found in each tile in parallel using DP. An in-memory database may be used to transfer data between the master nodes and the DP nodes, which may decrease the TAT.

Advantages of embodiments described herein may include, but are not limited to, improving the quality and computational performance of layout compression. Specifically, embodiments described herein can use distributed processing to decrease the time required to perform layout compression. Additionally, embodiments described herein can increase the number and/or size of repetition units that are detected by layout compression. Detecting a greater number of repetition units and/or larger-sized repetition units can reduce the amount of computation (which may include, but is not limited to, reducing processor utilization and/or memory usage) used by mask correction.

FIG. 1 illustrates a memory layout in accordance with some embodiments described herein.

Memory layout 100 may include an array of bit cells, a core area, and a logic area 102. The core area and the bit cells are shown as a grid in FIG. 1. The space between the grid lines may include bit cell circuitry. For example, bit cell area 104 may include polygon patterns that implement bit cells. The core area may include interconnections between bit cells and other functional circuits in memory layout 100. In FIG. 1, the core area is represented by the grid lines themselves, e.g., core area 106. The core area may also be referred to as a pitch cell area. The polygons that make up the core area is not shown in FIG. 1. Specifically, each horizontal and vertical line in core area 106 may itself include many polygons (which are too small to display in FIG. 1), and which may implement the core area circuitry. The repetition units in the core area may not be visually obvious or detectable using existing layout compression techniques. Embodiments described herein can detect and compress repetition units in core area 106 by using significantly less computational resources than other techniques.

Figure 2:
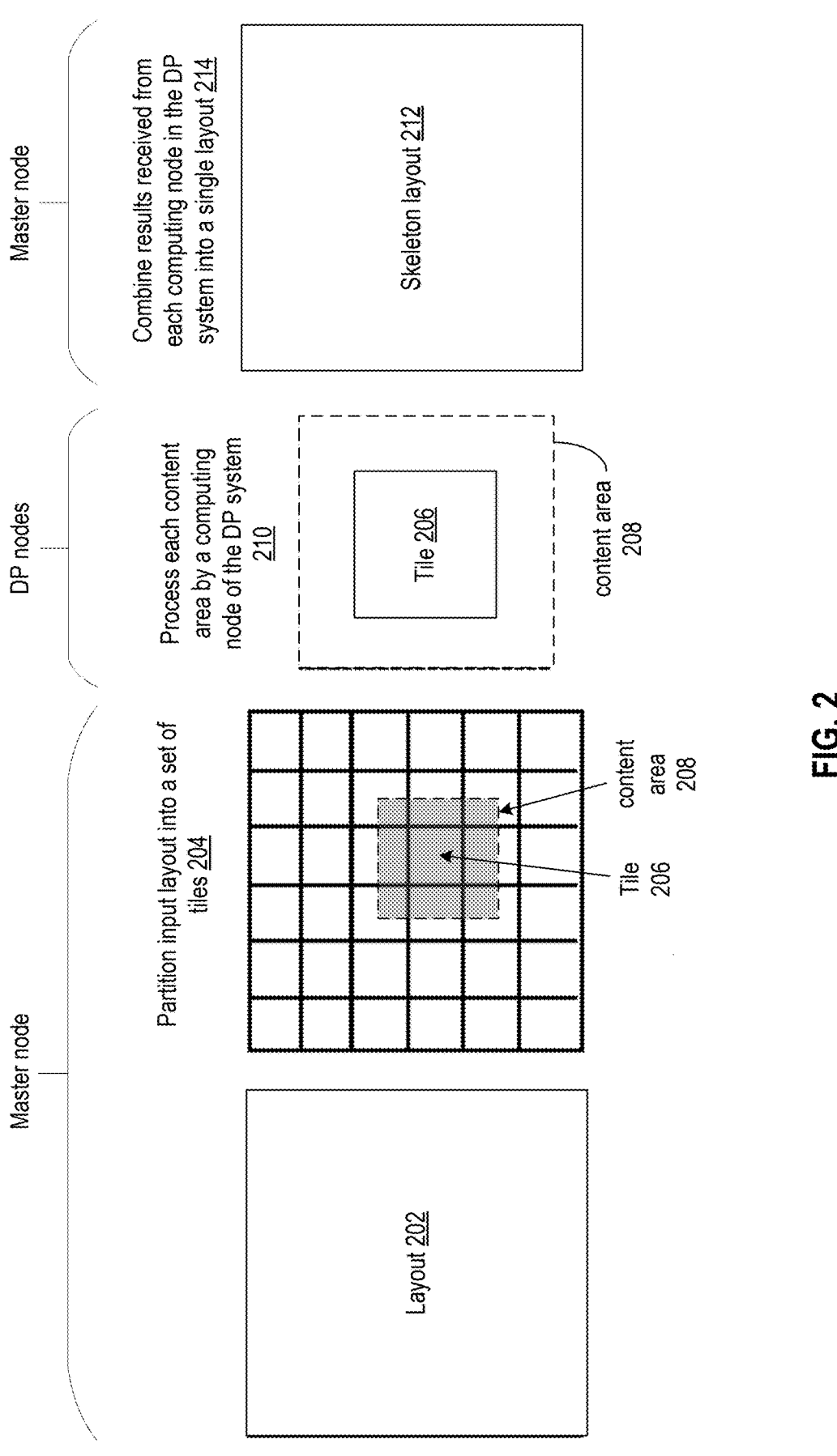
FIG. 2 illustrates a process that uses DP to perform layout compression in accordance with some embodiments described herein.

FIG. 2 illustrates a process that uses DP to perform layout compression in accordance with some embodiments described herein.

In some embodiments described herein, a DP system may be used to detect repetition units. Layout 202 may be received, which may be a full-chip size (e.g., 10 mm×10 mm) layout that may contain billions of polygons (which may be referred to as "graphics" in this disclosure) which implement the circuitry in an IC design. Layout 202 may include multiple layers, and one or more layers may describe the polygons in the core area of the memory chip.

Layout 202 may be partitioned into a set of tiles (at 204) at the master node in a DP system. Each tile, e.g., tile 206, may include a portion of layout 202. Partitioning the layout 202 into the set of tiles (at 204) may enable a DP system to divide the processing of layout 202 into multiple individual tasks, which may be processed in parallel by multiple computing nodes in the DP system. Each individual task may receive layout polygons that are within a content area (e.g., content area 208), which is larger than the tile (e.g., tile 206). The term "content area" may also be called a "context box" and may generally include an area in layout 202 that is larger than a tile. A content area may generally have any shape, including, but not limited to, a rectangular shape or a square shape. Thus, the boundaries of neighboring content areas may overlap each other, which may be important for boundary handling. Specifically, the overlap between neighboring content areas may ensure that the processing of the neighboring tiles is consistent with each other, which can help generate consistent results across layout 202. Each content area (e.g., content area 208) may be processed by a computing node in the DP system (at 210). The results of processing each content area may be sent back from each computing node to the master node. Specifically, the results of processing a content area may include repetition units that are detected in the content area. Once the results of processing each content area are sent back to the master node, the master node may combine the results and write the combined result into a single layout, which may be referred to as skeleton layout 212.

FIG. 3 illustrates a layout and a skeleton layout in accordance with some embodiments described herein.

Layout 300 may include multiple instances of the same polygon pattern, e.g., instances 302, 304, 306, and 308. Once a repetition unit has been identified, the instances of the repetition unit may be marked in the skeleton layout. For example, instances 352, 354, 356, and 358 of the repetition unit (e.g., polygon pattern 302) may be marked in skeleton layout 350. In some embodiments described herein, the layout and the skeleton layout may be represented using a standardized layout format, e.g., Open Artwork System Interchange Standard (OASIS). Thus, some embodiments described herein may analyze a layout to detect repetition units and generate a skeleton layout which specifies the locations of instances of each detected repetition unit.

A mask correction software application (e.g., which may be implemented as a set of instructions which executes on a processor) may receive a layout file and a corresponding skeleton layout file as inputs. Next, the mask correction software application may use the skeleton file to identify repetition units in the layout file. The mask correction software application may then perform geometric corrections on a single instance of a repetition unit and replace the multiple instances of the repetition unit with the corrected version of the repetition unit, which may substantially reduce the amount of computation used by the mask correction software application for correcting the layout.

FIG. 4 illustrates a process for pattern-based hierarchy exploration for compressing an IC design layout in accordance with some embodiments described herein.

The layout may be preprocessed (at 402), which may include, but is not limited to, fracturing complex patterns into polygons and converting non-90-degree angles or otherwise non-horizontal-vertical polygons into horizontal-vertical (HV) polygons (which may also be referred to as "Manhattan polygons") by replacing them with bounding boxes. The conversion of non-HV polygons to HV polygons may allow non-HV polygons to be processed together with HV polygons for performing repetition analysis. A complex two-dimensional (2D) shape may generate a large bounding box that overlaps with other polygons. For example, an L-shape polygon may create a large rectangle box that covers all polygons at the inner side of the "L". Therefore, some embodiments described herein fracture such complex shapes into simpler shapes (e.g., rectangles) before creating the bounding boxes.

The layout may be divided into zones (at 404), which may include, but is not limited to, recursively dividing the layout to identify zone boundaries, identifying fences or dividers between zones, and aligning the zone boundary based on the layout graphics. In some embodiments described herein, a "divide and conquer" strategy may be used to identify zone boundaries by dividing a large region into smaller regions and dividing the smaller regions into even smaller regions. This recursive dividing process may continue until a natural boundary is found and the graphics in the resulting regions (i.e., the regions that are formed by the recursive dividing process) can be processed using a scanline technique to identify repeating patterns. In this disclosure, a zone may refer to the region or area within a layout in which repetition analysis is performed. Repetition analysis may be performed in each zone separately.

In one representation, an IC design layout may be represented as a collection of polygons, where each polygon may be represented by the location of the vertices of the polygon. In a second representation, which may be referred to as an "image-based representation" or a "rasterized representation," the IC design layout may be represented as a collection of pixels, where pixels that are inside polygons may be assigned a first value and pixels that are outside polygons may be assigned a second value that is different from the first value.

Some embodiments described herein may use an image-based technique for identifying zones. Specifically, an image-based boundary detection technique may be used to identify boundaries in an image-based representation of a layout, and the identified boundaries may be used to partition the image-based representation into a set of zones.

For example, in a memory layout, core and logic areas may correspond to separate zones. The core area in a memory design may have the following characteristics: patterns are located within X and Y stripes, where the core area may include multiple stripes. These stripes may form a core area grid that separates bit cell array blocks from neighboring bit cell array blocks. The chunks of core area in the X-direction that lies between two Y-grids may be referred to as "X-arms." The chunks of the core area in the Y-direction that lies between two X-grids may be referred to as "Y-arms." Embodiments described herein may use image-based techniques to identify each X-arm and Y-arm as a zone.

FIG. 5 illustrates partitioning a layout into zones in accordance with some embodiments described herein.

Portion of layout 500 may be an image-based representation of a portion of an IC design layout. An image-based boundary detection technique may be used on portion of layout 500 to identify six zones 502, 504, 506, 508, 510, and 512. The boundary of the zones may be tentative at this point, i.e., the boundaries detected by the image-based technique may not be the final boundaries that are used for identifying zones in a layout.

Once zones are identified in the image-based representation of the IC design layout, more accurate locations of the zone boundaries may then be determined. In some embodiments described herein, the polygons at the zone image boundary neighborhood may be examined to check that the polygons end at an identified zone boundary. If the check is successful (i.e., the polygons indeed end at the identified zone boundaries), then the location of the zone boundary may be used as the final location. If the check is unsuccessful (i.e., the polygons do not end at the identified zone boundary), then the location of the zone boundary may be adjusted so that the zone boundary aligns with the end of the polygons. The adjusted zone boundary location may then be used as the final location. The final location of a zone boundary may be referred to as a "fence" in this disclosure.

An image-based technique to detect zone boundaries may be able to identify arms in a wide range of areas in an IC design layout, which may include, but are not limited to, core areas in memory designs and areas that include functional logic. Rules may be created for guiding the image-based zone identification technique to identify various geometries from testing the pixel values (e.g., 0 or 1) and the 2D configurations.

FIG. 6 illustrates identifying different zones in a memory layout using an image-based zone identification technique in accordance with some embodiments described herein.

In portion of memory layout 600, an image-based zone identification technique may be used to identify Y-arm zones (e.g., Y-arm zones 602), X-arm zones (e.g., X-arm zones 606), bitcell arrays (e.g., bitcell arrays 604), and cross zones (e.g., cross zones 608). Bitcell arrays 604 may include bitcell circuitry (i.e., circuitry to store bits). Y-arm zones 602 and X-arm zones 606 may include circuitry, which among other things, provides connections to the bitcells. Cross zones 608 may include circuitry which may correspond to both Y-arm zones and X-arm zones. For example, a cross zone may include connections between two X-arm zones and connections between two Y-arm zones.

Referring to FIG. 4, cell arrays may be detected in each zone (at 406), which may include, but is not limited to, determining cell arrays and pitch values using a scanline technique in each zone. In a scanline-based image processing technique, a scan line may be moved across an image and computations may be performed based on the image objects that intersect the scanline. For example, a scanline may be moved along the X-direction or the Y-direction. At each location of the scanline (which corresponds to either an X coordinate or a Y coordinate depending on whether the scanline is being moved along the X-direction or the Y-direction, respectively), polygons (which may be referred to as the "anchor") that intersects the scan line may be identified.

Distances between the polygon intersection points (i.e., the points where the polygons intersect with the scan line) may be determined along the scanline. These distances may be referred to as "spaces." If the distances have the same numerical value, the distance may be stored as a possible pitch value of an array. At different locations of the scanline (which correspond to different X or Y coordinates for the scanline), the array pitches may be different. In other words, multiple arrays with different pitches may be identified in a zone. The set of arrays and their pitch values may then be stored. In some embodiments described herein, a user may specify the number of arrays that are desired to be detected in a zone.

Referring to FIG. 4, repetition units and instances of repetition units may be detected (at 408), which may include, but is not limited to, determining array groups and pitch values for the array groups, and verifying the array groups and pitch values. Specifically, in a memory layout, X-arm zones and the Y-arm zones are typically thin, i.e., the aspect ratio of these zones is typically greater than or equal to five. Each X-arm or Y-arm may have multiple arrays. A group-pitch may be computed for each group of arrays, where the group-pitch may be equal to the least common multiple of the individual array pitch values in the group.

Some embodiments described herein may verify the group pitch value to prevent errors and to guarantee tile to tile consistency during the DP processing phase. In particular, some embodiments described herein may create detection boxes using the group pitch value and use the detection boxes to query the polygons (i.e., identify the polygons) that are covered by the boxes. Next, the embodiments may compute a hash value for each detection box based on the polygons. For example, the parameters that define a given set of polygons (e.g., the coordinates of the vertices) may be provided as input values to a hash function, and the output of the hash function may be used as the hash value that may uniquely correspond to the given set of polygons.

The hash values may be used as a key to identify detection boxes that potentially belong to the same array. In other words, two detection boxes with the same hash value may be assumed to belong to the same array. Next, for each array, the spaces between the detection boxes may be determined to confirm that the detection boxes belong to the same array. If the spaces between the detection boxes have the same value, then it confirms that the detection boxes belong to the same array, and the space value may be used as the repetition size for the zone.

A repetition unit may be selected as the representative repetition unit (at 410), which may include, but is not limited to, determining hash values for the repetition units and selecting a repetition unit based on the hash values.

Specifically, a hash value may be computed for each configuration of the polygons in each detection box. Each configuration may correspond to aligning the left-lower edge of the detection box with one of the inside polygon's left-lower edge. Next, a hash value may be computed based on the polygons in the detection box. Once hash values for the different configurations for each detection box have been computed, a unique hash value may be selected across all detection boxes. In some embodiments described herein, the configuration with the minimum hash value may be selected and used as the repetition unit.

FIG. 7 illustrates selecting a representative repetition unit in accordance with some embodiments described herein.

Array 702 may include a repetitive pattern. Configurations 704, 706, and 708 may be identified by aligning the left-lower edge of the detection box with one of the inside polygon's left-lower edge. For each configuration, a hash value may be computed based on the relative placement of polygons in each configuration. A configuration (e.g., configuration 704) corresponding to the lowest hash value may be selected as the representative repetition unit.

Referring to FIG. 4, a skeleton layout may be generated (at 412), which may include, but is not limited to, recalculating hash values for the repetition units across all DP computing nodes. Each DP node may generate one or more repetition units. When these repetition units are provided to the master node, the master node may check the consistency between repetition units identified by the different DP nodes. Specifically, the master node may compute hash values for different configurations provided by the different DP nodes and select a configuration across all DP nodes that has the lowest hash value. Embodiments described herein may ensure that the repetition units do not overlap with each other and that the repetition units are not missing between two neighboring tiles without analyzing the contents in the instances of the repetition unit.

In some embodiments described herein, the master node and the DP nodes may pass data between each other using a shared in-memory database. The shared in-memory database may be coupled, via a system bus, to a processor on the master node and the processors on the DP nodes. Specifically, when repetition boxes from each DP worker are sent back to the host computer, the data may be passed using an in-memory database instead of the data being passed through a file system. Using an in-memory database may enable the master node and the DP nodes to pass data between each other quickly, efficiently, and flexibly. Moreover, the type of data type exchanged may be changed on the fly. Using an in-memory database can substantially reduce the runtime, and the in-memory database may include key-value sorting capability, which can avoid performing sorting operation at the host node.

FIG. 8 illustrates a process for generating a skeleton layout from an IC design layout in accordance with some embodiments described herein.

An IC design layout may be partitioned into a set of content areas (at 802). Specifically, as shown in FIG. 2, the IC design layout may be partitioned into the set of content areas by partitioning the IC design layout into a set of abutting tiles and creating the set of content areas based on the set of abutting tiles, where each content area in the set of content areas is larger than and encloses a corresponding tile in the set of abutting tiles.

A content area in the set of content areas may be divided into a set of zones based on an image-based representation of the content area (at 804). Specifically, the content area may be divided into the set of zones by using an image-based boundary detection technique to detect a zone boundary in the content area. Further, the zone boundary may be optionally moved so that the zone boundary aligns with an edge of a polygon which is located within an ambit of the zone boundary.

A repetition unit may be determined in a zone in the set of zones, where the repetition unit is a portion of the zone, and wherein the zone includes multiple instances of the repetition unit (at 806). Specifically, the repetition unit may be determined by (1) determining a set of hash values corresponding to a set of detection boxes aligned with different polygon corners in the zone, (2) selecting a hash value in the set of hash values, and (3) selecting a detection box that corresponds to the hash value. In some embodiments described herein, a lowest hash value may be selected in the set of hash values. For example, in FIG. 7, configuration 704 may be selected as the repetition unit.

A skeleton layout corresponding to the IC design layout may be generated, where the skeleton layout specifies locations of the multiple instances of the repetition unit in the IC design layout (at 808). For example, in FIG. 3, skeleton layout 350 specifies locations of the multiple instances of the polygon pattern 302 (i.e., the repetition unit).

In some embodiments described herein, the process illustrated in FIG. 8 may be performed by a DP system, which includes the master node and a set of DP nodes. Specifically, partitioning the IC design layout into the set of content areas may be performed by a master node of DP system. Dividing the content area in the set of content areas into the set of zones may be performed by a DP node in the set of DP nodes. Determining the repetition unit in the zone in the set of zones may be performed by the DP node in the set of DP nodes. Generating the skeleton layout corresponding to the IC design layout may be performed by the master node.

In some embodiments described herein, the skeleton layout may be used to improve the performance of a mask correction software application executing on a processor. Specifically, an instance of the repetition unit may be selected from the multiple instances of the repetition unit specified in the skeleton layout. Mask correction may be performed on the instance of the repetition unit to obtain a corrected repetition unit. The multiple instances of the repetition unit in the IC design layout may be replaced by the corrected repetition unit.

Figure 9:
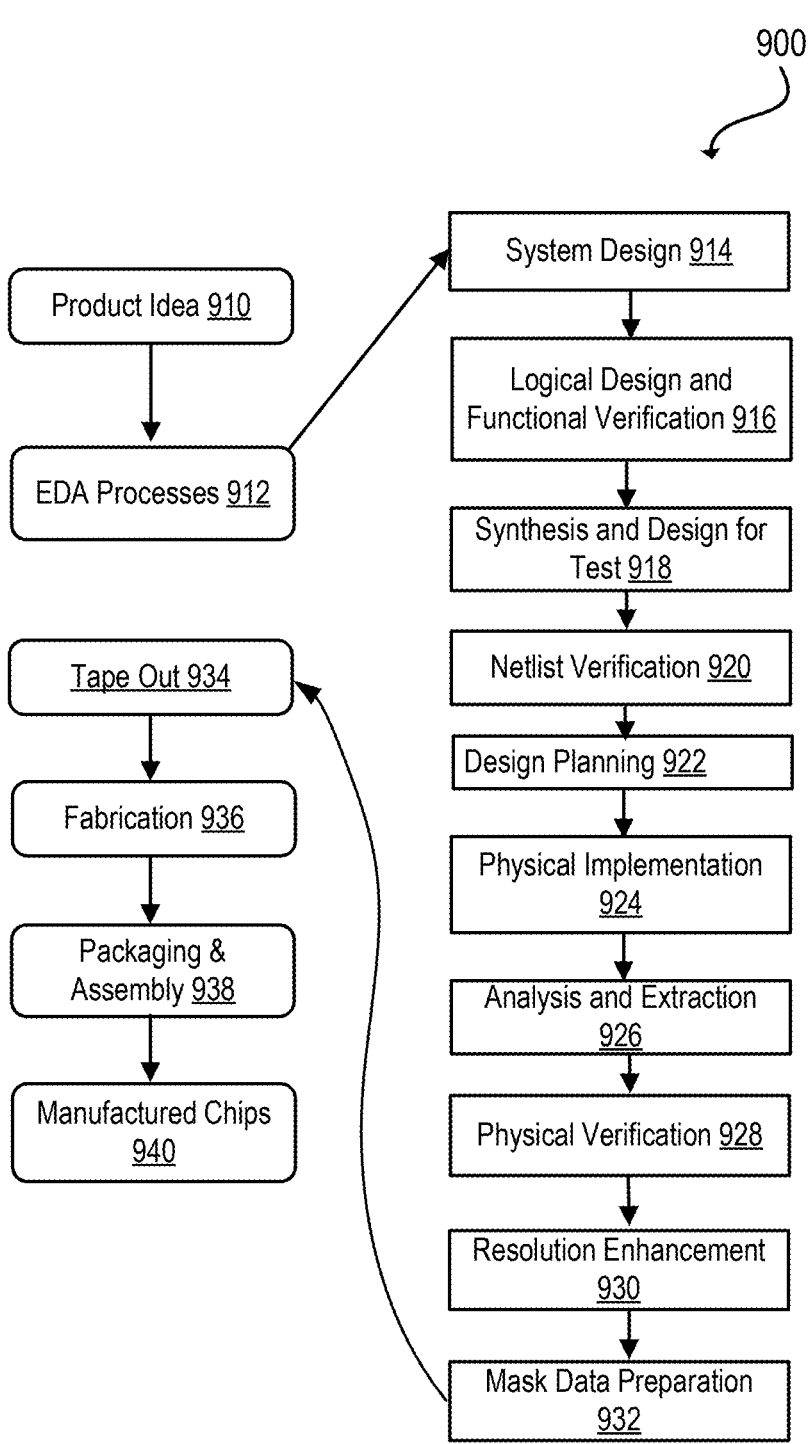
FIG. 9 illustrates an example set of processes used during the design, verification, and fabrication of an article of manufacture such as an integrated circuit to transform and verify design data and instructions that represent the integrated circuit.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 9. The processes described by be enabled by EDA products (or EDA systems).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
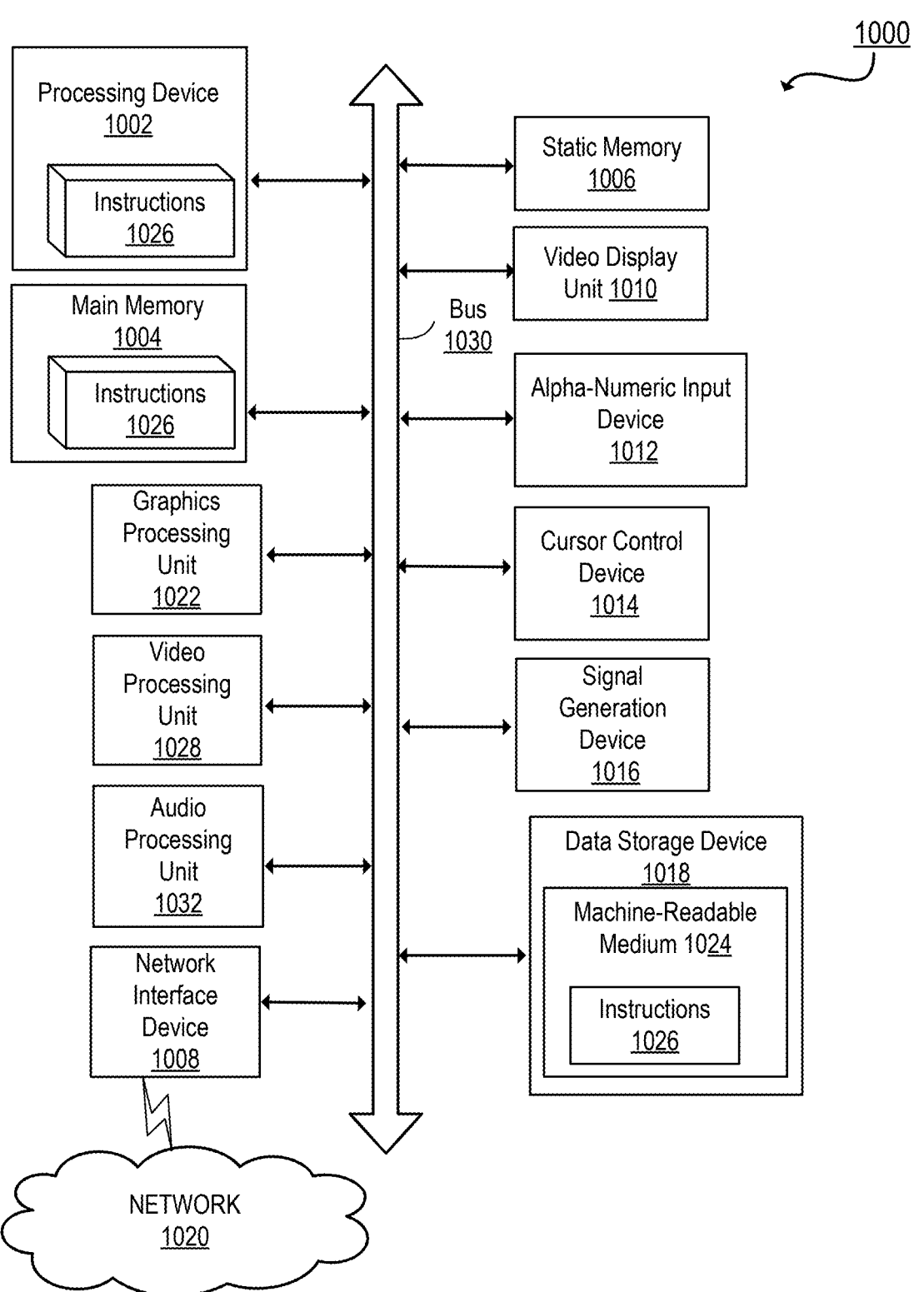
FIG. 10 illustrates an example machine of a computer system within which a set of instructions, for causing the machine to perform any one or more of the methodologies discussed herein, may be executed.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

partitioning an integrated circuit (IC) design layout into a set of content areas, wherein at least two adjacent content areas in the set of content areas overlap with each other;

dividing a content area in the set of content areas into a set of zones based on an image-based representation of the content area;

determining a repetition unit in a zone in the set of zones, wherein the repetition unit is a portion of the zone, and wherein the zone includes multiple instances of the repetition unit, and wherein determining the repetition unit in the zone in the set of zones comprises:

determining a set of bash values c rest or ding to a set of detection boxes aligned with different polygon corners in the zone;

selecting a hash value in the set of hash values; and selecting a detection box that corresponds to the hash value; and generating, by a processing device, a skeleton layout corresponding to the IC design layout, wherein the skeleton layout specifies locations of the multiple instances of the repetition unit in the IC design layout.

2. The method of claim 1, wherein the partitioning the IC design layout into the set of content areas comprises:

partitioning the IC design layout into a set of abutting tiles; and creating the set of content areas based on the set of abutting tiles, wherein each content area in the set of content areas is larger than and encloses a corresponding tile in the set of abutting tiles.

3. The method of claim 1, wherein the dividing the content area in the set of content areas into the set of zones comprises using an image-based boundary detection technique to detect a zone boundary in the content area.

4. The method of claim 3, wherein the dividing the content area in the set of content areas into the set of zones comprises moving the zone boundary so that the zone boundary aligns with an edge of a polygon which is located within an ambit of the zone boundary.

5. The method of claim 1, further comprising:

selecting an instance of the repetition unit from the multiple instances of the repetition unit specified in the skeleton layout;

performing mask correction on the instance of the repetition unit to obtain a corrected repetition unit; and replacing the multiple instances of the repetition unit by the corrected repetition unit in the IC design layout.

6. The method of claim 1, wherein the partitioning the IC design layout into the set of content areas is performed by a master node of a distributed processing (DP) system which includes the master node and a set of DP nodes, wherein the dividing the content area in the set of content areas into the set of zones is performed by a DP node in the set of DP nodes, wherein the determining the repetition unit in the zone in the set of zones is performed by the DP node in the set of DP nodes, and wherein the generating the skeleton layout corresponding to the IC design layout is performed by the master node.

7. A non-transitory computer-readable medium comprising stored instructions, which when executed by a processor, cause the processor to:

partition an integrated circuit (IC) design layout into a set of content areas;

divide a content area in the set of content areas into a set of zones based on an image-based representation of the content area, wherein dividing the content area in the set of content areas into the set of zones comprises using an image-based boundary detection technique to detect a zone boundary in the content area;

determine a repetition unit in a zone in the set of zones, wherein the repetition unit is a portion of the zone, and wherein the zone includes multiple instances of the repetition unit; and generate a skeleton layout corresponding to the IC design layout, wherein the skeleton layout specifies locations of the multiple instances of the repetition unit in the IC design layout.

8. The non-transitory computer-readable medium of claim 7, wherein partitioning the IC design layout into the set of content areas comprises:

partitioning the IC design layout into a set of abutting tiles; and creating the set of content areas based on the set of abutting tiles, wherein each content area in the set of content areas is larger than and encloses a corresponding tile in the set of abutting tiles.

9. The non-transitory computer-readable medium of claim 7, wherein dividing the content area in the set of content areas into the set of zones comprises moving the zone boundary so that the zone boundary aligns with an edge of a polygon which is located within an ambit of the zone boundary.

10. The non-transitory computer-readable medium of claim 7, wherein determining the repetition unit in the zone in the set of zones comprises:

determining a set of hash values corresponding to a set of detection boxes aligned with different polygon corners in the zone;

selecting a hash value in the set of hash values; and selecting a detection box that corresponds to the hash value.

11. The non-transitory computer-readable medium of claim 7, further comprising instructions, which when executed by the processor, cause the processor to:

select an instance of the repetition unit from the multiple instances of the repetition unit specified in the skeleton layout;

perform mask correction on the instance of the repetition unit to obtain a corrected repetition unit; and replace the multiple instances of the repetition unit by the corrected repetition unit in the IC design layout.

12. The non-transitory computer-readable medium of claim 7, wherein partitioning the IC design layout into the set of content areas is performed by a master node of a distributed processing (DP) system which includes the master node and a set of DP nodes, wherein dividing the content area in the set of content areas into the set of zones is performed by a DP node in the set of DP nodes, wherein determining the repetition unit in the zone in the set of zones is performed by the DP node in the set of DP nodes, and wherein generating the skeleton layout corresponding to the IC design layout is performed by the master node.

13. An apparatus, comprising:

a master node;

a set of distributed processing (DP) nodes;

wherein the master node comprises:

a first memory storing first instructions;

a first processor, coupled with the first memory and to execute the first instructions, the first instructions when executed causing the first processor to:

partition an integrated circuit (IC) design layout into a set of content areas;

provide a content area to a DP node in the set of DP nodes;

receive a repetition unit from the DP node; and generate a skeleton layout corresponding to the IC design layout, wherein the skeleton layout specifies locations of multiple instances of the repetition unit in the IC design layout; and wherein the DP node comprises:

a second memory storing second instructions;

a second processor, coupled with the second memory and to execute the second instructions, the second instructions when executed causing the second processor to:

receive the content area from the master node;

divide the content area into a set of zones based on an image-based representation of the content area;

determine a repetition unit in a zone in the set of zones, wherein the repetition unit is a portion of the zone, and wherein the zone includes the multiple instances of the repetition unit; and provide the repetition unit to the master node.

14. The apparatus of claim 13, wherein partitioning the IC design layout into the set of content areas comprises:

partitioning the IC design layout into a set of abutting tiles; and creating the set of content areas based on the set of abutting tiles, wherein each content area in the set of content areas is larger than and encloses a corresponding tile in the set of abutting tiles.

15. The apparatus of claim 13, wherein dividing the content area in the set of content areas into the set of zones comprises using an image-based boundary detection technique to detect a zone boundary in the content area.

16. The apparatus of claim 15, wherein dividing the content area in the set of content areas into the set of zones comprises moving the zone boundary so that the zone boundary aligns with an edge of a polygon which is located within an ambit of the zone boundary.

17. The apparatus of claim 13, wherein determining the repetition unit in the zone in the set of zones comprises:

determining a set of hash values corresponding to a set of detection boxes aligned with different polygon corners in the zone;

selecting a hash value in the set of hash values; and selecting a detection box that corresponds to the hash value.

18. The apparatus of claim 13, wherein the first instructions, which when executed by the first processor, cause the first processor to:

select an instance of the repetition unit from the multiple instances of the repetition unit specified in the skeleton layout;

perform mask correction on the instance of the repetition unit to obtain a corrected repetition unit; and replace the multiple instances of the repetition unit by the corrected repetition unit in the IC design layout.

\* \* \* \* \*